United States Patent
Zheng et al.

(10) Patent No.: US 10,311,822 B2
(45) Date of Patent: Jun. 4, 2019

(54) CONTENT DEPENDENT COMMON VOLTAGE DRIVER SYSTEMS AND METHODS

(71) Applicant: Apple Inc., Cupertino, CA (US)

(72) Inventors: Fenghua Zheng, San Jose, CA (US); Howard H. Tang, San Diego, CA (US); Sandro H. Pintz, Menlo Park, CA (US)

(73) Assignee: APPLE INC., Cupertino, CA (US)

( * ) Notice: Subject to any disclaimer, the term of this patent is extended or adjusted under 35 U.S.C. 154(b) by 150 days.

(21) Appl. No.: 15/667,366

(22) Filed: Aug. 2, 2017

(65) Prior Publication Data

US 2018/0061355 A1    Mar. 1, 2018

Related U.S. Application Data

(60) Provisional application No. 62/378,501, filed on Aug. 23, 2016.

(51) Int. Cl.

| | |
|---|---|
| *G09G 3/36* | (2006.01) |
| *H03F 1/02* | (2006.01) |
| *G06T 1/20* | (2006.01) |
| *G09G 3/20* | (2006.01) |
| *G09G 5/00* | (2006.01) |

(52) U.S. Cl.
CPC ............. *G09G 3/3685* (2013.01); *G06T 1/20* (2013.01); *G09G 3/2092* (2013.01); *G09G 3/3614* (2013.01); *G09G 3/3655* (2013.01); *G09G 5/003* (2013.01); *H03F 1/0211* (2013.01);

(Continued)

(58) Field of Classification Search
CPC ........ G09G 3/00; G09G 3/3696; G09G 3/006; G09G 3/2092; G09G 3/3614; G09G 3/3655; G09G 3/3685; G09G 2310/021; G09G 2310/0205; G09G 2310/02; G09G 2310/00; G09G 2310/08; G09G 2310/0291; G09G 2320/029; G09G 2320/232; G09G 2320/0223; G09G 2330/12; G09G 2340/16; G09G 2340/00; G09G 2340/14

See application file for complete search history.

(56) References Cited

U.S. PATENT DOCUMENTS

| | | |
|---|---|---|
| 7,342,449 B2 | 3/2008 | Ishii et al. |
| 7,907,136 B2 | 3/2011 | Kobayashi |

(Continued)

*Primary Examiner* — Michael Pervan
(74) *Attorney, Agent, or Firm* — Fletcher Yoder PC

(57) ABSTRACT

Systems and methods are provided for improving displayed image quality of an electronic display with reduced power consumption. In some embodiments, a display pixel in the electronic display includes a pixel electrode and a common electrode. A pixel electrode driver electrically coupled to the first display pixel writes the display pixel by supplying a pixel voltage signal to the pixel electrode. A common electrode driver electrically coupled to the common electrode includes a power amplifier that supplies a common voltage signal to the common electrode to predictively offset net charge accumulation expected in the common electrode; a first power supply rail selectively connectable to the power amplifier based on a target voltage of the common voltage signal; and a second power supply rail selectively connectable to the power amplifier based on the target voltage, in which the first and second power supply rails supply different voltages when connected.

20 Claims, 7 Drawing Sheets

(52) U.S. Cl.
CPC ... *G09G 2360/16* (2013.01); *H03F 2200/507* (2013.01); *H03F 2200/511* (2013.01)

(56) References Cited

U.S. PATENT DOCUMENTS

| | | | |
|---|---|---|---|
| 8,350,797 B2 | 1/2013 | Song et al. | |
| 9,293,080 B2 | 3/2016 | Kishi et al. | |
| 2007/0001978 A1* | 1/2007 | Cho | G09G 3/3655 345/98 |
| 2007/0290979 A1 | 12/2007 | Lee et al. | |
| 2008/0278429 A1* | 11/2008 | Chen | G09G 3/3655 345/98 |
| 2009/0267884 A1* | 10/2009 | Takahashi | G09G 3/3648 345/96 |
| 2011/0037747 A1* | 2/2011 | Lee | G09G 3/3655 345/211 |
| 2012/0026148 A1* | 2/2012 | Hashimoto | G09G 3/3655 345/211 |
| 2012/0127142 A1* | 5/2012 | Yoo | G09G 3/3614 345/208 |
| 2016/0189662 A1* | 6/2016 | Cho | G09G 3/3655 345/211 |
| 2016/0260407 A1* | 9/2016 | Zheng | G09G 3/3614 |

\* cited by examiner

CONTENT DEPENDENT COMMON VOLTAGE DRIVER SYSTEMS AND METHODS

CROSS-REFERENCE TO RELATED APPLICATIONS

This application is a Non-Provisional Application claiming priority to U.S. Provisional Patent Application No. 62/378,501, entitled "CONTENT DEPENDENT COMMON VOLTAGE DRIVER SYSTEMS AND METHODS," filed Aug. 23, 2016, which is herein incorporated by reference in its entirety for all purposes.

BACKGROUND

The present disclosure relates generally to electronic displays and, more particularly, to common voltage drivers used in the electronic displays.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Electronic devices often use one or more electronic displays to present visual representations of information as text, still images, and/or video by displaying one or more image frames. For example, such electronic devices may include computers, mobile phones, portable media devices, tablets, televisions, virtual-reality headsets, and vehicle dashboards, among many others. To display an image frame, an electronic display may control light emission (e.g., actual luminance) from its display pixels, for example, based on image data that indicates target (e.g., desired) luminance of the display pixels. In particular, the light emission from a display pixel may depend on magnitude of analog electrical (e.g., voltage and/or current) signals supplied (e.g., applied) to the display pixel.

For example, in a liquid crystal display (LCD), light emission from a display pixel may depend on orientation of liquid crystals, which may be controlled by magnitude of an electric field produced due to voltage difference between its pixel electrode and a common electrode. Thus, an image frame may be written to the display pixels by supplying pixel voltage signals to the pixel electrodes of the display pixels based at least in part on the image data. However, in some instances, writing a portion of an image frame to a display pixel may inject charge into the common electrode, thereby potentially affecting the common electrode voltage. Thus, when the common electrode is shared between multiple display pixels, charge injection in the common electrode caused by writing one display pixel may affect light emission from the other display pixels.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure generally relates to improving displayed image quality of an electronic display with reduced power consumption. In some embodiments, an electronic display may display an image frame based at least in part on image data, which indicates target luminance of display pixels in the electronic display for displaying the image frame. Additionally, in some embodiments, the electronic display may control light emission (e.g., actual luminance) of the display pixels by controlling magnitude of analog electrical signals (e.g., pixel voltage signals) supplied to the display pixels, thereby writing the image frame to the display pixels.

However, in some instances, writing one display pixel may also affect light emission from one or more other display pixels. For example, supplying a pixel voltage signal to a pixel electrode of a display pixel may inject charge into a common electrode of the display pixel, which may affect the common electrode voltage. When the common electrode is shared with another display pixel, changes in the common electrode voltage may affect light emission from the other display pixel.

Accordingly, the present disclosure provides techniques for improving displayed image quality by predictively compensating (e.g., offsetting) charge accumulation in a common electrode caused by writing display pixels. To facilitate predictive compensation, a display pipeline may determine charge injection expected to result from writing an image frame to one or more display pixels. Since positive charge injection and negative charge injection may cancel, the display pipeline may determine net charge accumulation in the common electrode expected to result from writing a group display pixels based on corresponding expected charge injections.

Based at least in part on the expected net charge accumulation, a common electrode driver may predictively adjust voltage of a common voltage signal supplied to the common electrode. In particular, a target voltage of the common voltage signal may be determined based at least in part on the expected net charge accumulation such that supplying the common voltage signal at the target voltage is expected to substantially offset actual net charge accumulation that results from writing the group of display pixels. In this manner, the likelihood of causing a change in the common electrode voltage due to writing the group of display pixel may be reduced, thereby reducing likelihood of writing the group of display affecting light emission and, thus, facilitating improved displayed image quality.

In some embodiments, the common electrode driver may include a power amplifier to facilitate generating the common voltage signal. In particular, the power amplifier may generate the common voltage signal by controlling electrical power supplied from a power supply rail to an output, thereby enabling the common electrode driver to control voltage of the common voltage signal. As such, electrical power may be consumed to enable generating the common voltage signal. In some embodiments, the power consumption may be dependent on voltage of the electrical power supplied from the power supply rail to the power amplifier.

To facilitate reducing power consumption, the common electrode driver may utilize multiple selectively connectable power supply rails. In some embodiments, the common electrode driver may utilize multiple selectively connectable positive voltage rails, which each provides electrical power at a different positive voltage when connected. Additionally or alternatively, the common electrode driver may utilize multiple selectively connectable negative voltage rails, which each provides electrical power at a different negative voltage when connected. Since power consumption may be dependent on voltage of electrical power supplied, the common electrode driver may connect the power amplifier to at least one selectively connectable power supply rail, which is expected to be provide sufficient electrical power to enable generating the target common voltage signal, and disconnect the other one or more selectively connectable power supply rails from the power amplifier.

In other words, the common electrode driver may selectively connect the power amplifier to a power supply rail based at least in part on target voltage of the common voltage signal. For example, the common electrode driver may selectively connect the power amplifier to one of multiple positive voltage rails based at least in part on peak positive voltage of the target common voltage signal over a control horizon. To help illustrate, the common electrode driver may connect a first positive supply rail that supplies a first positive voltage greater than the peak positive voltage and disconnect a second positive supply rail that supplies a second positive voltage that is greater than the first positive voltage or less than the peak positive voltage.

Additionally or alternatively, the common electrode driver may selectively connect the power amplifier to one of multiple negative voltage rails based at least in part on peak negative voltage of the target common voltage signal over the control horizon. To help illustrate, the common electrode driver may connect a first negative supply rail that supplies a first voltage greater than the peak negative voltage and disconnect a second negative supply rail that supplies a second negative voltage that is greater than the first negative voltage or less than the peak negative voltage. In this manner, the techniques described herein may enable the common electrode driver to improve perceived image quality by predictively generating the common voltage signal to offset (e.g., compensate) expected net charge accumulation with reduced power consumption.

It should be noted that, in some embodiments, ability of the power amplifier to increase voltage of the common voltage signal using a higher voltage power supply rail may be less than instantaneous. In other words, even though a higher voltage power supply rail is connected, the power amplifier may be unable to output voltages substantially equal to the higher voltage until some duration after the higher voltage power supply rail is connected. Thus, in some embodiments, the common electrode driver may selectively connect higher voltage power supply rails in advance, for example, while a previous group of display pixels is being written. On the other hand, the common electrode driver may selectively connect lower voltage power supply rails as soon as it is determined that the lower voltage is expected to be sufficient, which may facilitate further reducing power consumption.

BRIEF DESCRIPTION OF THE DRAWINGS

Various aspects of this disclosure may be better understood upon reading the following detailed description and upon reference to the drawings in which.

DETAILED DESCRIPTION

Figure 1:
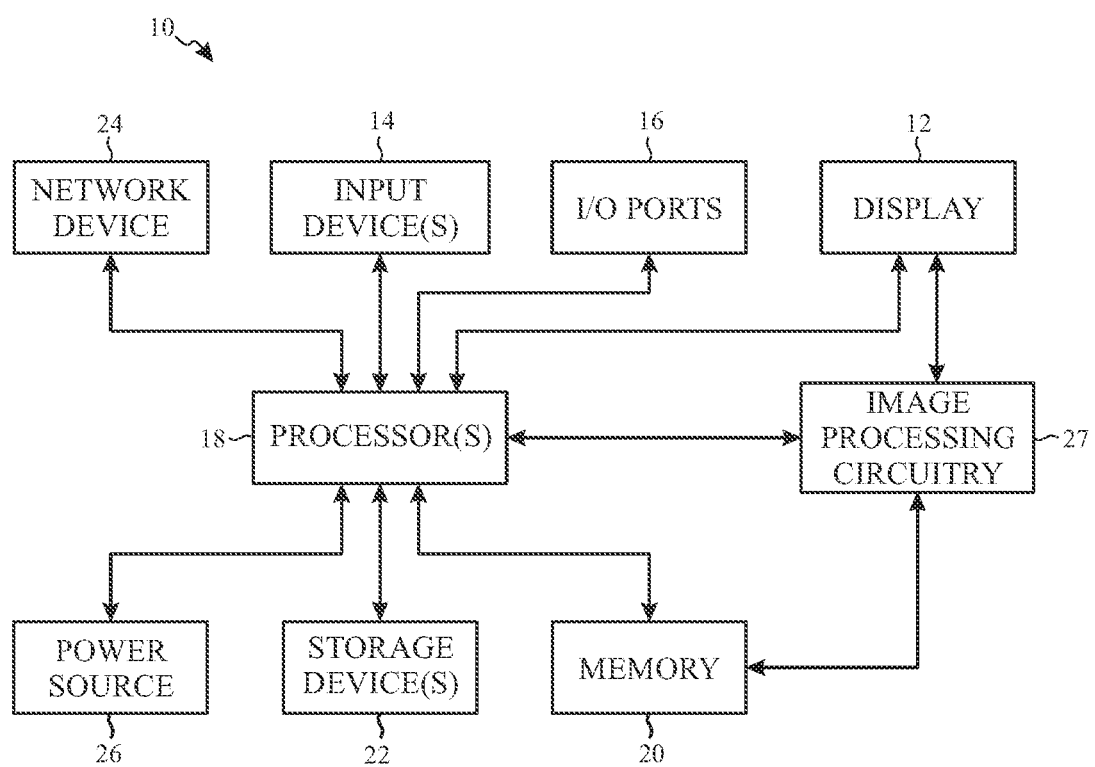
FIG. 1 is a block diagram of an electronic device used to display image frames, in accordance with an embodiment.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

An electronic display may display an image frame based at least in part on corresponding image data. In particular, the image data may indicate target luminance (e.g., grayscale level) of each display pixel in the electronic display for displaying the image frame. Additionally, in some instances, light emission from a display pixel may be dependent on electrical energy stored in the display pixel. For example, in a liquid crystal display (LCD), light emission from a display pixel may be dependent on voltage of electrical energy stored in its pixel electrode. More specifically, voltage difference between the pixel electrode and a common electrode may produce an electric field, which controls orientation of liquid crystals and, thus, light emission from the display pixel. It should be appreciated that discussion with regard to LCD displays is merely intended to be illustrative. In particular, the techniques described herein may be applied to other types of electronic displays, such as organic light-emitting diode (OLED) displays.

Accordingly, to control light emission from a display pixel, the electronic display may control magnitude of analog electrical (e.g., voltage and/or current) signals supplied to the display pixel. For example, increasing magnitude of a pixel voltage signal supplied to a display pixel may increase magnitude of the electric field produced and, thus, light emission from the display pixel. On the other hand, decreasing magnitude of the pixel voltage signal supplied to the display pixel may decrease magnitude of the electric field produced and, thus, light emission from the display pixel. In other words, the electronic display may write the image frame to display pixels by supplying analog electrical signals (e.g., pixel voltage signals) to the display pixels based at least in part on the image data.

However, in some instances, writing one display pixel may also affect light emission from another display pixel. In particular, supplying a pixel voltage signal to a pixel electrode may inject charge into a corresponding common electrode. For example, supplying a positive pixel voltage signal may inject charge with a first (e.g., negative) polarity into the common electrode. On the other hand, supplying a negative pixel voltage signal may inject charge a second (e.g., positive) polarity into the common electrode.

In some instances, injecting charge into the common electrode may cause charge accumulation in the common electrode, thereby affecting the common electrode voltage. Thus, when a common electrode is shared by multiple display pixels, changes in the common electrode voltage caused by writing one display pixel may affect electric field produced in and thus, light emission, from another display pixel. In fact, in some instances, this may cause perceivable variations between actual luminance and target luminance of one or more display pixels when displaying the image frame, thereby affecting perceived image quality.

Accordingly, the present disclosure provides techniques for improving displayed image quality of an electronic display by predictively compensating (e.g., offsetting) charge accumulation in a common electrode caused by writing display pixels. To facilitate predictive compensation, a display pipeline may determine charge injection expected to result from writing an image frame to one or more display pixels. In some embodiments, charge injection resulting from writing a display pixel may be dependent at least in part on magnitude and/or polarity of a pixel voltage signal supplied to its pixel electrode. Thus, in such embodiments, the display pipeline may determine an indication of expected charge injection caused by writing the display pixel based on expected polarity and/or target magnitude of the pixel voltage signal to be supplied to the pixel electrode.

To reduce likelihood of polarizing display pixels, electronic displays may implement inversion schemes that vary polarity of pixel voltage signals supplied to the display pixels. Thus, in some embodiments, the display pipeline may determine expected polarity of a pixel voltage signal to be supplied to a pixel electrode based at least in part on implemented inversion scheme and/or location on a display panel. Additionally, as described above, image data may indicate target luminance of display pixels for displaying an image frame and magnitude of pixel voltage signals supplied may control light emission from the display pixels. Thus, in some embodiments, the display pipeline may determine target magnitude of a pixel voltage signal to be supplied to a pixel electrode by processing corresponding image data.

Since positive charge injection and negative charge injection may cancel, the display pipeline may determine net charge accumulation in the common electrode expected to result from writing a group display pixels based on expected charge injection corresponding to writing each display pixel in the group. Additionally, since charge accumulation may affect the common electrode voltage, a common electrode driver may adaptively adjust voltage of a common voltage signal supplied to the common electrode when the group of display pixels is to be written based at least in part on the expected net charge accumulation. For example, the common electrode driver may increase voltage of the common voltage signal when the expected net charge accumulation has a negative (e.g., less than a target common electrode voltage) polarity and decrease voltage of the common voltage signal to when the expected net charge accumulation has a positive (e.g., greater than the target common electrode voltage) polarity. In this manner, net charge accumulation resulting from writing the group of display pixels may be predictively compensated, which may facilitate maintaining the common electrode voltage relatively constant (e.g., reduced duration of spikes) thereby, improving perceived image quality.

As described above, charge injection resulting from writing a display pixel may be dependent on magnitude of a pixel voltage signal supplied to its pixel electrode and, thus, content dependent. Accordingly, the common voltage signal expected to sufficiently compensate resulting net charge accumulation may also be content dependent. In other words, the common electrode driver may make varying adjustments to the common voltage signal. For example, the common electrode driver may adjust (e.g., increase or decrease) voltage of the common electrode signal a larger amount when magnitude of the net charge accumulation is larger and a smaller amount when the magnitude of the net charge accumulation is smaller.

To facilitate adjusting the common voltage signal, the common electrode driver may include a power amplifier that generates the common voltage signal by controlling electrical power supplied from a power supply rail to an output based on a common voltage control signal, which indicates target voltage of the common voltage signal. Thus, to generate the common voltage signal, the common electrode driver may consume electrical power. In some embodiments, power consumption of the common electrode driver may be dependent on voltage of electrical power supplied from the power supply rail to the power amplifier.

To facilitate reducing power consumption, the common electrode driver may utilize multiple power supply rails, which each supplies electrical power at a different voltage. For example, the common electrode driver may utilize multiple positive voltage rails, which each provides electrical power at different positive voltages when connected to the power amplifier. Additionally or alternatively, the common electrode driver may utilize multiple negative voltage rails, which each provides electrical power at different negative voltages when connected to the power amplifier.

By utilizing multiple power supply rails, the common electrode driver may selectively connect the power amplifier to one or more of the multiple power supply rails based at least in part on target voltage of the common voltage signal. For example, in some embodiments, the common electrode driver may selectively connect the power amplifier to one of multiple positive voltage rails and/or to one of multiple negative voltage rails expected to enable generating the target common voltage signal. In other words, the common electrode driver may selectively connect the one positive voltage rail based at least in part on peak positive voltage of the target common voltage signal and/or the one negative voltage rail based at least in part on peak negative voltage of the target common voltage signal.

To facilitate reducing power consumption, the connected positive voltage rail, compared to the other positive voltage rails, may output the lowest magnitude positive voltage greater than the peak positive voltage. Additionally or alternatively, the connected negative voltage rail, compared to the other negative voltage rails, may output the lowest magnitude negative voltage greater than the peak negative voltage. In this manner, the techniques described herein may enable the common electrode driver to improve perceived image quality by predictively generating the common voltage signal to offset (e.g., compensate) expected net charge accumulation with reduced power consumption.

To help illustrate, an electronic device 10 including an electronic display shown in FIG. 1. As will be described in more detail below, the electronic device 10 may be any suitable electronic device, such as a computer, a mobile phone, a portable media device, a tablet, a television, a virtual-reality headset, a vehicle dashboard, and the like. Thus, it should be noted that FIG. 1 is merely one example of a particular implementation and is intended to illustrate the types of components that may be present in an electronic device 10.

In the depicted embodiment, the electronic device 10 includes the electronic display 12, one or more input devices 14, one or more input/output (I/O) ports 16, a processor core complex 18 having one or more processor(s) or processor cores, local memory 20, a main memory storage device 22, a network interface 24, a power source 26, and image processing circuitry 27. The various components described in FIG. 1 may include hardware elements (e.g., circuitry), software elements (e.g., a tangible, non-transitory computer-readable medium storing instructions), or a combination of both hardware and software elements. It should be noted that the various depicted components may be combined into fewer components or separated into additional components. For example, the local memory 20 and the main memory storage device 22 may be included in a single component. Additionally, the image processing circuitry 27 (e.g., a graphics processing unit) may be included in the processor core complex 18.

As depicted, the processor core complex 18 is operably coupled with local memory 20 and the main memory storage device 22. Thus, the processor core complex 18 may execute instruction stored in local memory 20 and/or the main memory storage device 22 to perform operations, such as generating and/or transmitting image data. As such, the processor core complex 18 may include one or more general purpose microprocessors, one or more application specific processors (ASICs), one or more field programmable logic arrays (FPGAs), or any combination thereof.

In addition to instructions, the local memory 20 and/or the main memory storage device 22 may store data to be processed by the processor core complex 18. Thus, in some embodiments, the local memory 20 and/or the main storage device 22 may include one or more tangible, non-transitory, computer-readable mediums. For example, the local memory 20 may include random access memory (RAM) and the main memory storage device 22 may include read only memory (ROM), rewritable non-volatile memory such as flash memory, hard drives, optical discs, and the like.

As depicted, the processor core complex 18 is also operably coupled with the network interface 24. In some embodiments, the network interface 24 may facilitate communicating data with another electronic device and/or a network. For example, the network interface 24 (e.g., a radio frequency system) may enable the electronic device 10 to communicatively couple to a personal area network (PAN), such as a Bluetooth network, a local area network (LAN), such as an 802.11x Wi-Fi network, and/or a wide area network (WAN), such as a 4G or LTE cellular network.

Additionally, as depicted, the processor core complex 18 is operably coupled to the power source 26. In some embodiments, the power source 26 may provide electrical power to one or more component in the electronic device 10, such as the processor core complex 18 and/or the electronic display 12. Thus, the power source 26 may include any suitable source of energy, such as a rechargeable lithium polymer (Li-poly) battery and/or an alternating current (AC) power converter.

Furthermore, as depicted, the processor core complex 18 is operably coupled with the I/O ports 16. In some embodiments, the I/O ports 16 may enable the electronic device 10 to interface with other electronic devices. For example, a portable storage device may be connected to an I/O port 16, thereby enabling the processor core complex 18 to communicate data with a portable storage device.

As depicted, the electronic device 10 is also operably coupled with input devices 14. In some embodiments, the input device 14 may facilitate user interaction with the electronic device 10, for example, by receiving user inputs. Thus, the input devices 14 may include a button, a keyboard, a mouse, a trackpad, and/or the like. Additionally, in some embodiments, the input devices 14 may include touch-sensing components in the electronic display 12. In such embodiments, the touch sensing components may receive user inputs by detecting occurrence and/or position of an object touching the surface of the electronic display 12.

In addition to enabling user inputs, the electronic display 12 may include a display panel with one or more display pixels. As described above, the electronic display 12 may control light emission from the display pixels to present visual representations of information, such as a graphical user interface (GUI) of an operating system, an application interface, a still image, or video content, by display image frames based at least in part on corresponding image data. As depicted, the electronic display 12 is operably coupled to the processor core complex 18 and the image processing circuitry 27. In this manner, the electronic display 12 may display image frames based at least in part on image data generated by the processor core complex 18, the image processing circuitry 27. Additionally or alternatively, the electronic display 12 may display image frames based at least in part on image data received via the network interface 24 and/or the I/O ports 16.

Figure 2:
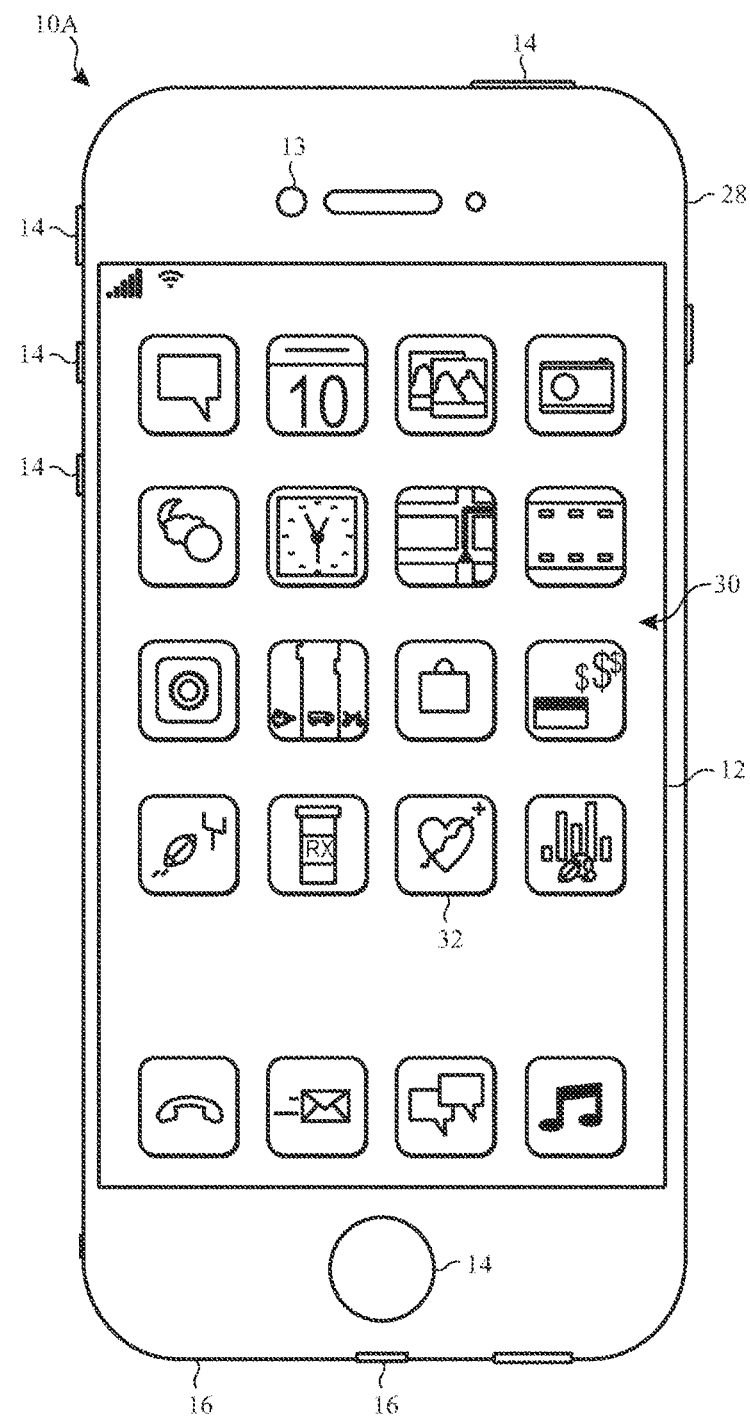
FIG. 2 is one example of the electronic device of FIG. 1, in accordance with an embodiment.

As described above, the electronic device 10 may be any suitable electronic device. To help illustrate, one example of a suitable electronic device 10, specifically a handheld device 10A, is shown in FIG. 2. In some embodiments, the handheld device 10A may be a portable phone, a media player, a personal data organizer, a handheld game platform, and/or the like. For example, the handheld device 10A may be a smart phone, such as any iPhone® model available from Apple Inc.

As depicted, the handheld device 10A includes an enclosure 28 (e.g., housing). In some embodiments, the enclosure 28 may protect interior components from physical damage and/or shield them from electromagnetic interference. Additionally, as depicted, the enclosure 28 surrounds the electronic display 12. In the depicted embodiment, the electronic display 12 is displaying a graphical user interface (GUI) 30 having an array of icons 32. By way of example, when an icon 32 is selected either by an input device 14 or a touch-sensing component of the electronic display 12, an application program may launch.

Furthermore, as depicted, input devices 14 open through the enclosure 28. As described above, the input devices 14 may enable a user to interact with the handheld device 10A. For example, the input devices 14 may enable the user to activate or deactivate the handheld device 10A, navigate a user interface to a home screen, navigate a user interface to a user-configurable application screen, activate a voice-recognition feature, provide volume control, and/or toggle between vibrate and ring modes. As depicted, the I/O ports 16 also open through the enclosure 28. In some embodiments, the I/O ports 16 may include, for example, an audio jack to connect to external devices.

Figure 3:
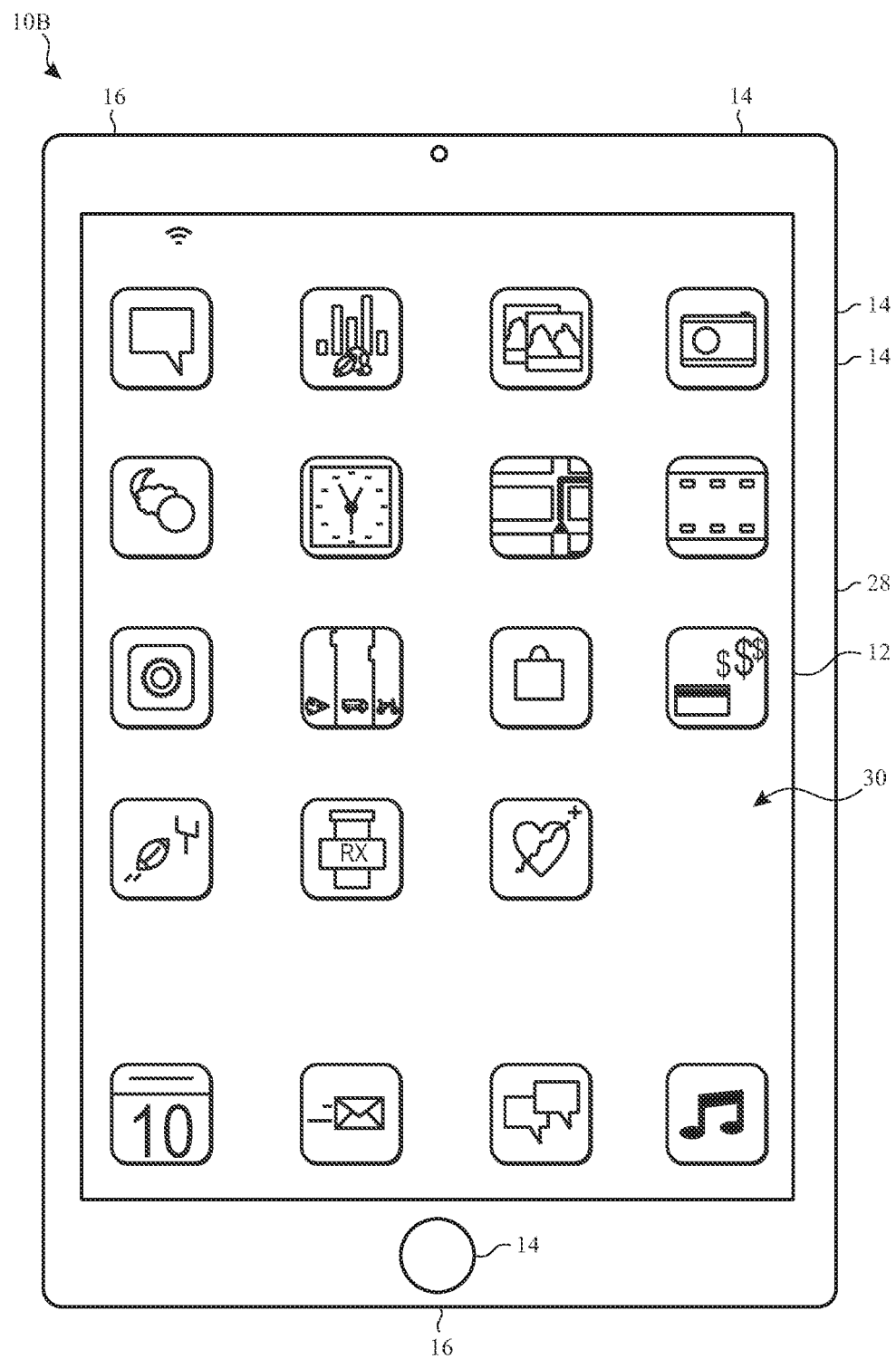
FIG. 3 is another example of the electronic device of FIG. 1, in accordance with an embodiment.
Figure 4:
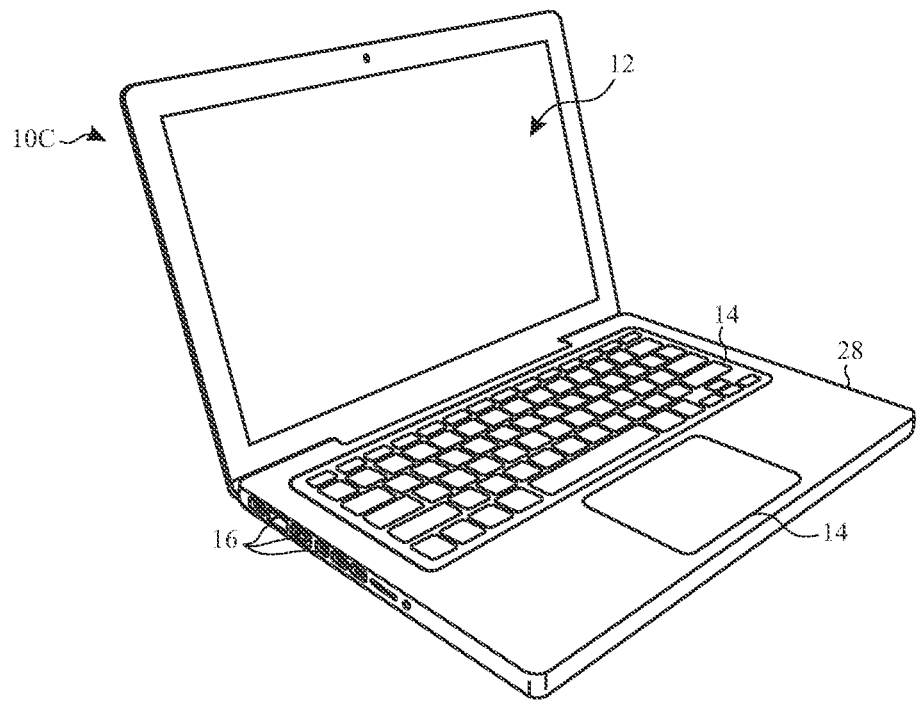
FIG. 4 is another example of the electronic device of FIG. 1, in accordance with an embodiment.
Figure 5:
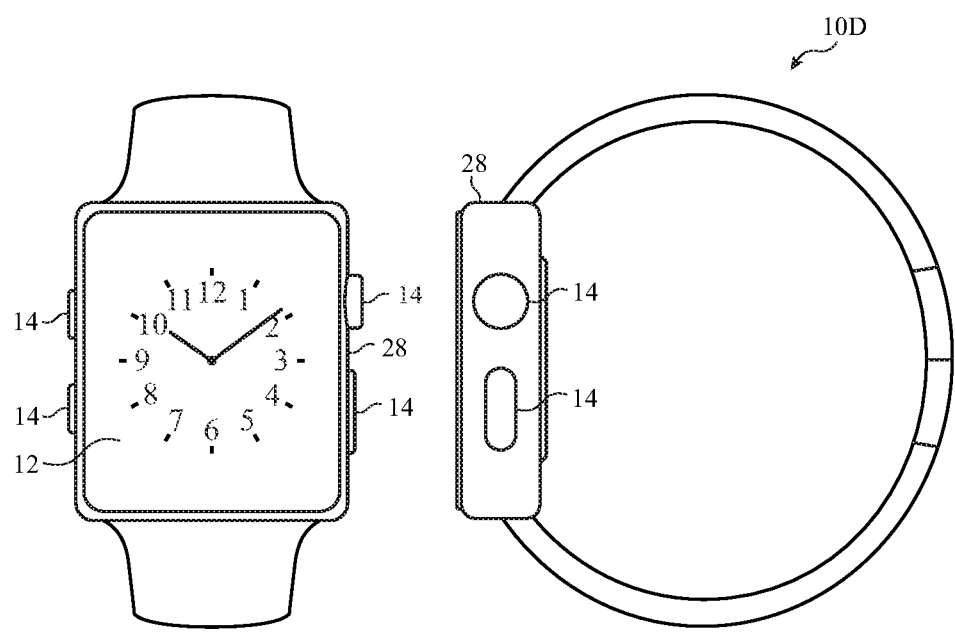
FIG. 5 is another example of the electronic device of FIG. 1, in accordance with an embodiment.

To further illustrate, another example of a suitable electronic device 10, specifically a tablet device 10B, is shown in FIG. 3. For illustrative purposes, the tablet device 10B may be any iPad® model available from Apple Inc. A further example of a suitable electronic device 10, specifically a computer 10C, is shown in FIG. 4. For illustrative purposes, the computer 10C may be any Macbook® or iMac® model available from Apple Inc. Another example of a suitable electronic device 10, specifically a watch 10D, is shown in FIG. 5. For illustrative purposes, the watch 10D may be any Apple Watch® model available from Apple Inc. As depicted, the tablet device 10B, the computer 10C, and the watch 10D each also includes an electronic display 12, input devices 14, I/O ports 16, and an enclosure 28.

As described above, the electronic display 12 may display image frames based at least in part on image data received, for example, from the processor core complex 18 and/or the image processing circuitry 27. Additionally, based on the image data, the electronic display 12 may write image frames by supplying analog electrical signals to the display pixels to control light emission from the display pixels. To facilitate improving perceived image quality, in some embodiments, a display pipeline may process the image data before being used to display image frames.

Figure 6:
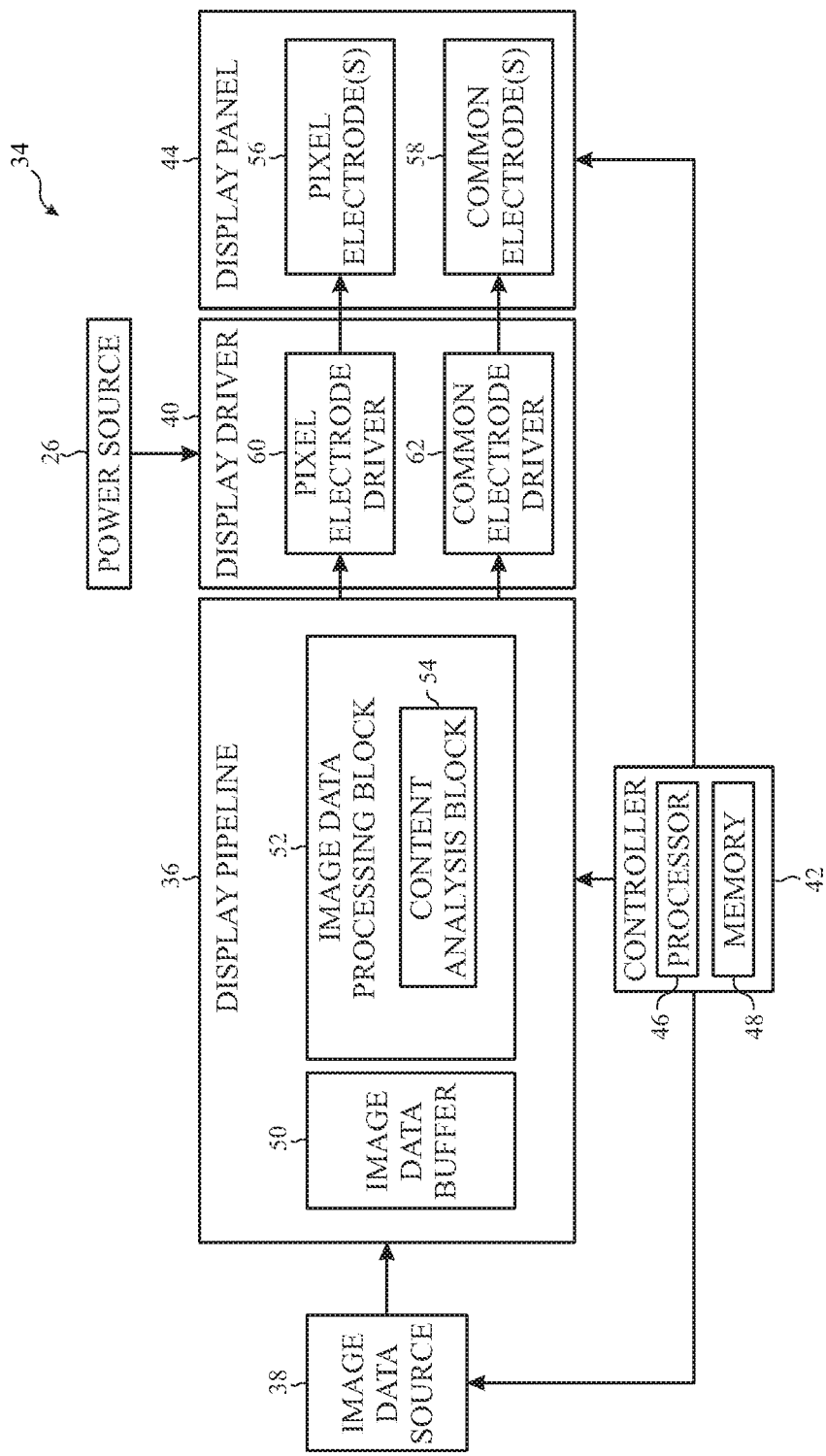
FIG. 6 is block diagram of a portion of the electronic device of FIG. 1 used to display image frames, in accordance with an embodiment.

To help illustrate, a portion 34 of the electronic device 10 including a display pipeline 36 is shown in FIG. 6. In some embodiments, the display pipeline 36 may be implemented by circuitry in the electronic device 10, circuitry in the electronic display 12, or a combination thereof. For example, the display pipeline 36 may be included in the processor core complex 18, the image processing circuitry 27, a timing controller (TCON) in the electronic display 12, or any combination thereof.

As depicted, the portion 34 of the electronic device 10 also includes the power source 26, an image data source 38, a display driver 40, a controller 42, and a display panel 44. In some embodiments, the controller 42 may control operation of the display pipeline 36, the image data source 38, and/or the display driver 40. To facilitate controlling operation, the controller 42 may include a controller processor 46 and controller memory 48. In some embodiments, the controller processor 46 may execute instructions stored in the controller memory 48. Thus, in some embodiments, the controller processor 46 may be included in the processor core complex 18, the image processing circuitry 27, a timing controller in the electronic display 12, a separate processing module, or any combination thereof. Additionally, in some embodiments, the controller memory 48 may be included in the local memory 20, the main memory storage device 22, a separate tangible, non-transitory, computer readable medium, or any combination thereof.

In the depicted embodiment, the display pipeline 36 is communicatively coupled to the image data source 38. In this manner, the display pipeline 36 may receive image data from the image data source 38. As described above, in some embodiments, the image data source 38 may be included in the processor core complex 18, the image processing circuitry 27, or a combination thereof.

Additionally, in the depicted embodiment, the display pipeline 36 includes an image data buffer 50 to store image data, for example, received from the image data source 38. In some embodiments, the image data buffer 50 may store image data to be processed by and/or already processed by the display pipeline 36. For example, the image data buffer 50 may store image data corresponding with multiple image frames (e.g., a previous image frame, a current image frame, and/or a subsequent image frame). Additionally, the image data buffer may store image data corresponding with multiple portions (e.g., a previous row, a current row, and/or a subsequent row) of an image frame.

To process the image data, the display pipeline 36 may include one or more image data processing blocks 52. For example, in the depicted embodiment, the image data processing blocks 52 include a content analysis block 54. Additionally, in some embodiments, the image data processing block 52 may include an ambient adaptive pixel (AAP) block, a dynamic pixel backlight (DPB) block, a white point correction (WPC) block, a sub-pixel layout compensation (SPLC) block, a burn-in compensation (BIC) block, a panel response correction (PRC) block, a dithering block, a sub-pixel uniformity compensation (SPUC) block, a content frame dependent duration (CDFD) block, an ambient light sensing (ALS) block, or any combination thereof.

To facilitate displaying an image frame, the content analysis block 54 may process the corresponding image data to determine content of the image frame. For example, the content analysis block 54 may process the image data to determine target luminance of display pixels for displaying the image frame. Additionally, the content analysis block 54 may determine control signals, which instruct the display driver 40 to generate and supply analog electrical signals to the display panel 44. To facilitate generating the analog electrical signals, the display driver 40 may receive electrical power from the power source 26, for example, via one or more power supply rails. In particular, the display driver 40 may control supply of electrical power from the one or more power supply rails to display pixels in the display panel 44.

As described above, each display pixel of the display panel 44 may include a pixel electrode 56 and a common electrode 58. The pixel electrode 56 may be unique to the particular display pixel, whereas the common electrode 58 may be shared between multiple display pixels. For example, in some embodiments, the display panel 44 may include a single common electrode 58 used by all display pixels. In other embodiments, the display panel 44 may include multiple common electrodes 58, and each of the common electrodes 58 may be used by a different group (e.g., block) of display pixels.

Thus, in some embodiments, the content analysis block 54 may determine pixel voltage control signals that each indicates a target pixel voltage signal to be supplied to a pixel electrode 56. Based at least in part on the pixel voltage control signals, a pixel electrode driver 60 may write display pixels by generating and supplying pixel voltage signals to control light emission from the display pixels. Accordingly, in some embodiments, the content analysis block 54 may determine the pixel voltage control signals based at least in part on target luminance of corresponding display pixels.

Additionally, in some embodiments, the content analysis block 54 may determine a common voltage control signal that indicates a target common voltage signal to be supplied to a common electrode 58. Based at least in part on the common voltage control signal, a common electrode driver 62 may generate and supply a common voltage signal to the common electrode 58 to facilitate controlling the common electrode voltage. As described above, perceived image quality may be improved by maintaining the common electrode voltage relatively constant at a target common electrode voltage (e.g., approximately zero volts or ground).

However, as described above, writing display pixels may cause a net charge accumulation, which may affect the common electrode voltage even when a constant common voltage signal is supplied to the common electrode 58. Thus, in some embodiments, the content analysis block 54 may determine the target common voltage signal based at least in part on expected net charge accumulation and/or the target common electrode voltage. Additionally, in some embodiments, the content analysis block 54 may determine a supply rail control signal based at least in part on the target common voltage signal, which may be used by the common electrode driver 62 to facilitate reducing power consumption when generating the common voltage signal.

Figure 7:
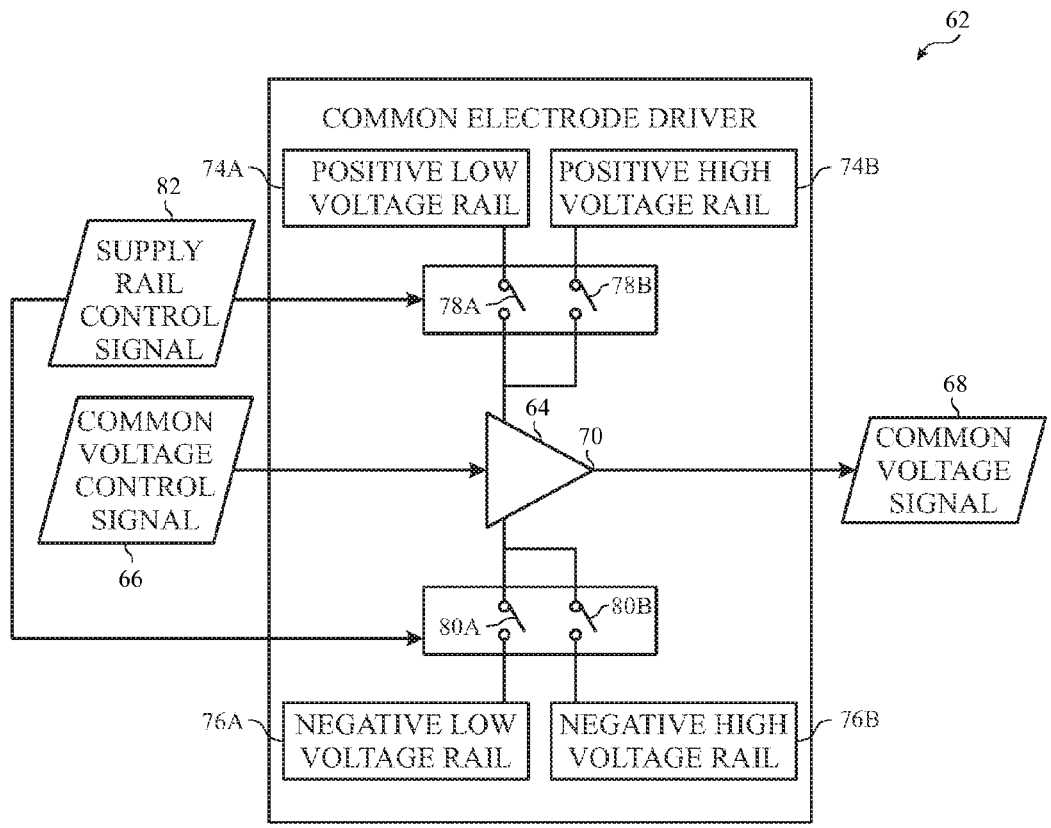
FIG. 7 is a block diagram of a common electrode driver in the electronic device portion of FIG. 6, in accordance with an embodiment.

To help illustrate, a more detailed view of one embodiment of the common electrode driver 62 is shown in FIG. 7. As depicted, the common electrode driver 62 includes a power amplifier 64 (e.g., class-G) that receives a common voltage control signal 66 and outputs a common voltage signal 68. In some embodiments, the common electrode driver 62 may generate the common voltage signal 68 by amplifying the common voltage control signal 66 using electrical power supplied via one or more power supply rails.

Since polarity of the common voltage signal 68 may vary, the common electrode driver 62 may include one or more positive voltage supply rails 74 (e.g., positive voltage power supply rails) and one or more negative voltage supply rails 76 (e.g., negative voltage power supply rails). Additionally, since magnitude of the common voltage signal 68 may vary, the common electrode driver 62 may include multiple power supply rails, which each supplies electrical power with a different voltage when connected to the power amplifier 64. For example, in the depicted embodiment, the common electrode driver 62 includes a positive low voltage rail 74A, which supplies electrical power at a first positive voltage (e.g., 1.8 volts) when connected, and a positive high voltage rail 74B, which supplies electrical power at a second positive voltage (e.g., 5.5 volts) when connected. Additionally, the common electrode driver 62 includes a negative low voltage rail 76A, which supplies electrical power at a first negative voltage (e.g., −1.8 volts) when connected, and a negative high voltage rail 76B, which supplies electrical power at a second negative voltage (e.g., 5.5 volts) when connected.

It should be understood that two positive voltage rails 74 and two negative voltage rails 76 are described merely for illustrative purposes. In other embodiments, the common electrode driver 62 may include any number of positive voltage rails 74 and/or any number negative voltage rails 76. For example, in another embodiment, the common electrode driver 62 may include two positive voltage rails 74 and a single negative voltage rail 76.

As depicted, the common electrode driver 62 includes a positive switching device 78 electrically coupled between each positive voltage rail 74 and the power amplifier 64. In operation, a positive switching device 78 may close to connect a positive voltage rail 74 to the power amplifier 64 and open to disconnect the positive voltage rail 74 from the power amplifier 64. Additionally, as depicted, the common electrode driver 62 includes a negative switching device 80 electrically coupled between each negative voltage rail 76 and the power amplifier 64. In operation, a negative switching device 80 may close to connect a negative voltage rail 76 to the power amplifier 64 and open to disconnect the negative voltage rail 76 from the power amplifier 64. In this manner, the common electrode driver 62 may selectively connect each positive voltage rails 74 and/or each the negative voltage rails 76 to the power amplifier 64.

Since power consumption may vary based at least in part on voltage of electrical power supplied to the power amplifier 64, the common electrode driver 62 may selectively connect one positive voltage rail 74 to the power amplifier 64 based at least in part target voltage of the common voltage signal 68. In some embodiments, to facilitate reducing power consumption, the common electrode driver 62 may connect the positive voltage rail 74 that outputs the lowest magnitude positive voltage greater than peak positive voltage of the target common voltage signal. For example, the common electrode driver 62 may instruct a first positive switching device 78A to connect the positive low voltage rail 74A and a second positive switching device 78B to disconnect the positive high voltage rail 74B when the peak target positive voltage is less than a first positive voltage (e.g., 1.8 volts) supplied by the positive low voltage rail 74A. On the other hand, the common electrode driver 62 may instruct the first positive switching device 78A to disconnect the positive low voltage rail 74A and the second positive switching device 78B to connect the positive high voltage rail 74B when the peak target positive voltage is greater than the first positive voltage supplied by the positive low voltage rail 74A, but less than a second positive voltage (e.g., 5.5 volts) supplied by the positive high voltage rail 74B.

In a similar manner, the common electrode driver 62 may selectively connect one negative voltage rail 76 to the power amplifier 64 based at least in part target voltage of the common voltage signal 68. In some embodiments, to facilitate reducing power consumption, the common electrode driver 62 may connect the negative voltage rail 76 that outputs the lowest magnitude negative voltage greater than peak negative voltage of the target common voltage signal. For example, the common electrode driver 62 may instruct a first negative switching device 80A to connect the negative low voltage rail 76A and a second negative switching device 80B to disconnect the negative high voltage rail 76B when peak target negative voltage is less than a first negative voltage (e.g., −1.8 volts) supplied by the negative low voltage rail 76A. On the other hand, the common electrode driver 62 may instruct the first negative switching device 80A to disconnect the negative low voltage rail 76A and the second negative switching device 80B to connect the negative high voltage rail 76B when peak target negative voltage is greater than the first negative voltage output supplied by the negative low voltage rail 76A, but less than a second negative voltage (e.g., −5.5 volts) supplied by the negative high voltage rail 76B.

As described above, the content analysis block 54 may process the image data to determine a common voltage control signal 66, which indicates the target common voltage signal. Additionally, the content analysis block 54 may determine a supply rail control signal 82, for example, based on peak positive and/or peak negative voltage of the target common voltage signal. Thus, as in the depicted embodiment, the supply rail control signal 82 may be supplied to and instruct the positive switching devices 78 and/or the negative switching device 80 to open or close based on target voltage of the common voltage signal 68. Additionally or alternatively, the common electrode driver 62 may determine target common voltage signal based on the common voltage control signal 66 and instruct the positive switching devices 78 and/or the negative switching devices 80 to open or close accordingly. Thus, in operation, the common electrode driver 62 may enable generating the common voltage signal 68 with reduced power consumption.

Figure 8:
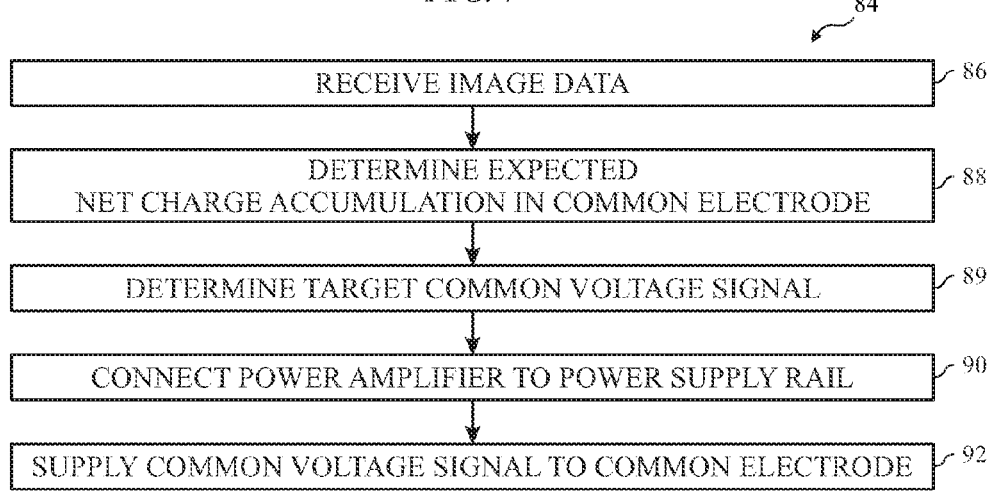
FIG. 8 is a flow diagram of a process for controlling operation of the common electrode driver of FIG. 7, in accordance with an embodiment.

To help illustrate, one embodiment of a process 84 for controlling operation of a common electrode driver 62 is described in FIG. 8. Generally, the process 84 includes receiving image data (process block 86), determining expected net charge accumulation in a common electrode (process block 88), determining a target common voltage signal (process block 89), connecting a power amplifier to a power supply rail (process block 90), and supplying a common voltage signal to the common electrode (process block 92). In some embodiments, the process 84 may be implemented by executing instructions stored in tangible, non-transitory, media, such as the controller memory 48, using processing circuitry, such as the controller processor 46.

As described above, in some embodiments, the display pipeline 36 may receive image data from an image data source 38 (process block 86). In some embodiments, image data source 38 may communicate image data corresponding with an image frame to the display pipeline 36 when the image frame is to be displayed. Additionally, in some embodiments, the display pipeline 36 may utilize the image data buffer 50 to store image data corresponding with multiple image frames and/or multiple portions (e.g., rows) of each image frame.

After receiving the image data, the display pipeline 36 may process the image data using one or more image data processing block 52, such as the content analysis block 54. For example, the content analysis block 54 may process the image data to determine target luminance of display pixels for displaying the corresponding image frame. Additionally, the content analysis block 54 may determine pixel voltage control signals, which indicate pixel voltage signals expected to result in the target luminance when written to the display pixels. Based at least in part on the magnitude and/or polarity of the pixel voltage signals, the content analysis block 54 may determine net charge accumulation expected to result in the common electrode 58 (process block 88)

Figure 9:
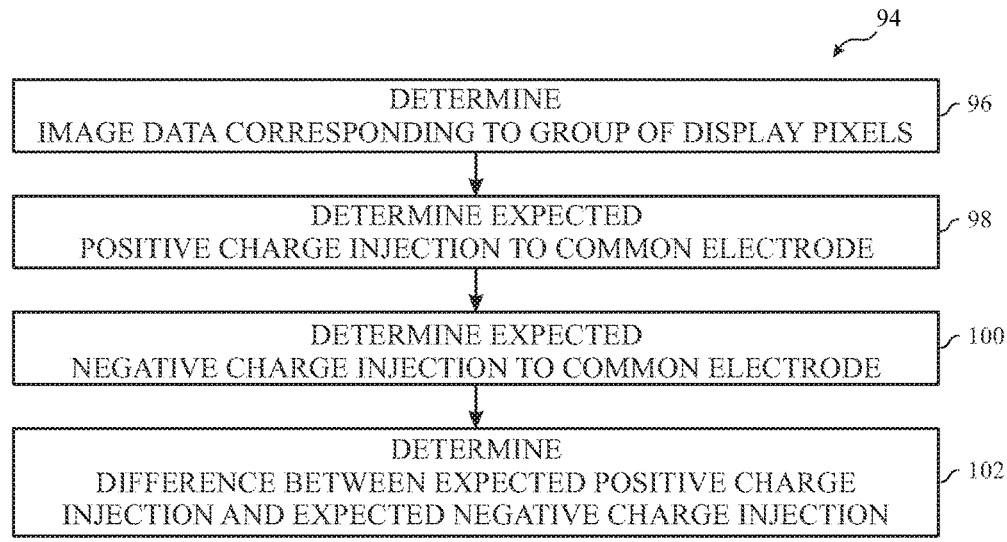
FIG. 9 is a flow diagram of a process for determining expected net charge accumulation in a common electrode, in accordance with an embodiment.

To help illustrate, one embodiment of a process 94 for determining net charge accumulation expected to result from writing a group of display pixels is described in FIG. 9. Generally, the process 94 includes determining image data corresponding to a group of display pixels (process block 96), determining expected positive charge injection in a common electrode (process block 98), determining expected negative charge injection in the common electrode (process block 100), and determining difference between the expected positive charge injection and the expected negative charge injection (process block 102). In some embodiments, the process 94 may be implemented by executing instructions stored in tangible, non-transitory, media, such as the controller memory 48, using processing circuitry, such as the controller processor 46.

Accordingly, in some embodiments, the display pipeline 36 may determine image data corresponding with a group of display pixels (process block 96). In some embodiments, the group may include a portion of display pixels that share a common electrode 58. For example, when the display panel 44 includes a single common electrode 58, the group may include a first row of display pixels and a second row of display pixels. Additionally, when the display panel 44 includes multiple common electrodes 58, the group may include a portion of the first row and a portion of the second row that share one common electrode 58. In other embodiments, the group may include each display pixel that shares a common electrode 58.

As described above, image data may be stored in the image data buffer 50. Thus, in some embodiments, the display pipeline 36 may retrieve the image data corresponding with the group of display pixels from the image data buffer 50. Additionally or alternatively, the image data may be received directly from the image data source 38.

By processing the image data, the display pipeline 36 may determine positive charge injection expected to result from writing the display pixel group (process block 98) and the negative charge injection expected to result when the image frame is written to the group of display pixels (process block 100). In some embodiments, positive charge may be injected to a common electrode 58 when a pixel voltage signal with a first (e.g., negative) polarity is supplied to a pixel electrode 56. On the other hand, negative charge may be injected to a common electrode 58 when a pixel voltage signal with a second (e.g., opposite or positive) polarity is supplied to the pixel electrode 56. Additionally, magnitude of the charge injection may be dependent on magnitude of the pixel voltage signal supplied to the pixel electrode 56.

Thus, the display pipeline 36 may determine expected polarity and/or target magnitude of pixel voltage signals to be supplied to the pixel electrodes 56 in the display pixel group. In some embodiments, the display pipeline 36 may determine expected polarity based on inversion scheme implemented in the display panel 44 and/or location of display pixels on the display panel 44. For example, when the row inversion is implemented and the display pixel group includes two rows, the display pipeline 36 may determine that expected polarity of pixel voltage signals to be supplied to a first row have a first (e.g., positive) polarity and expected polarity of pixel voltage signals to be supplied to a second row have a second (e.g., opposite or negative) polarity.

Additionally, in some embodiments, the display pipeline 36 may determine target magnitude based at least in part on image data corresponding to the display pixel group. As described above, the image data may indicate target luminance of the display pixels and magnitude of pixel voltage signals supplied may control light emission (e.g., actual luminance) from the display pixels. Thus, the display pipeline 36 may determine target pixel voltage signals expected to result in the target luminance when supplied to the display pixel group.

Based on the expected polarity and/or target magnitude of the pixel voltage signals, the display pipeline 36 may determine an indication of the expected positive charge injection. In some embodiments, a positive charge injection metric that indicates the expected positive charge injection may be the sum of pixel voltage signals of a first (e.g., negative) polarity to be supplied to the pixel electrodes 56 in the display pixel group. To help illustrate, continuing with the above example, the display pipeline 36 may determine the positive charge injection metric by summing together the pixel voltage signals to be supplied to the second row of display pixels.

In a similar manner, the display pipeline 36 may determine an indication of the expected negative charge injection based on the expected polarity and/or target magnitude of the pixel voltage signals. In some embodiments, a negative charge injection metric that indicates the expected negative charge injection may be the sum of pixel voltage signals of a second (e.g., opposite or positive) polarity to be supplied to the pixel electrodes 56 in the display pixel group. To help illustrate, continuing with the above example, the display pipeline 36 may determine the negative charge injection metric by summing together the pixel voltage signals to be supplied to the first row of display pixels.

Since positive charge injection and negative charge injection cancel, the display pipeline 36 may determine expected net charge accumulation in the common electrode 58 based on difference between the expected positive charge injection and the expected negative charge injection (process block 102). In some embodiments, the display pipeline 36 may determine the expected net charge accumulation by comparing the positive charge injection metric and the negative charge injection metric. For example, the display pipeline 36 may determine that polarity of the expected net charge accumulation is positive when magnitude of the positive charge injection metric is greater than magnitude of the negative charge injection metric. On the other hand, the display pipeline 36 may determine that polarity of the expected net charge accumulation is negative when magnitude of the negative charge injection metric is greater than magnitude of the positive charge injection metric. Furthermore, the display pipeline 36 may determine magnitude of the expected net charge accumulation based on difference between magnitude of the positive charge injection metric and magnitude of the negative charge injection metric.

In this manner, the display pipeline 36 may determine expected net charge accumulation before writing an image frame to the display pixel group is completed. To help illustrate, continuing with the above example, the display pipeline 36 may determine expected net charge accumulation resulting from writing the first display pixel row and the second display pixel row before actually writing the first display pixel row, the second display pixel row, or both. When the display pixels are divided into multiple groups, the display pipeline 36 may similarly determine expected net charge accumulation resulting from writing other display pixel groups.

Returning to the process 84 of FIG. 8, the display pipeline 36 may determine a target common voltage signal based at least in part on the expected net charge accumulation (process block 89). As described above, net charge accumulation may affect the common electrode voltage and, thus, perceive luminance of display pixels. As such, the display pipeline 36 may determine the target common voltage signal such that it is expected to sufficiently offset (e.g., compensate) the expected net charge accumulation. In this manner, the net charge accumulation may be predictively compensated, thereby reducing likelihood of causing perceivable visual artifacts.

Based at least in part on the target common voltage signal, the common electrode driver 62 may selectively connect one or more power supply rails to the power amplifier 64 (process block 90). For example, the common electrode driver 62 may selectively connect one of multiple positive voltage rails 74 to the power amplifier 64 based at least in part on peak positive voltage of the target common voltage signal. Additionally or alternatively, the common electrode driver 62 may selectively connect one of multiple negative voltage rails 76 to the power amplifier 64 based at least in part on peak negative voltage of the target common voltage signal.

Figure 10:
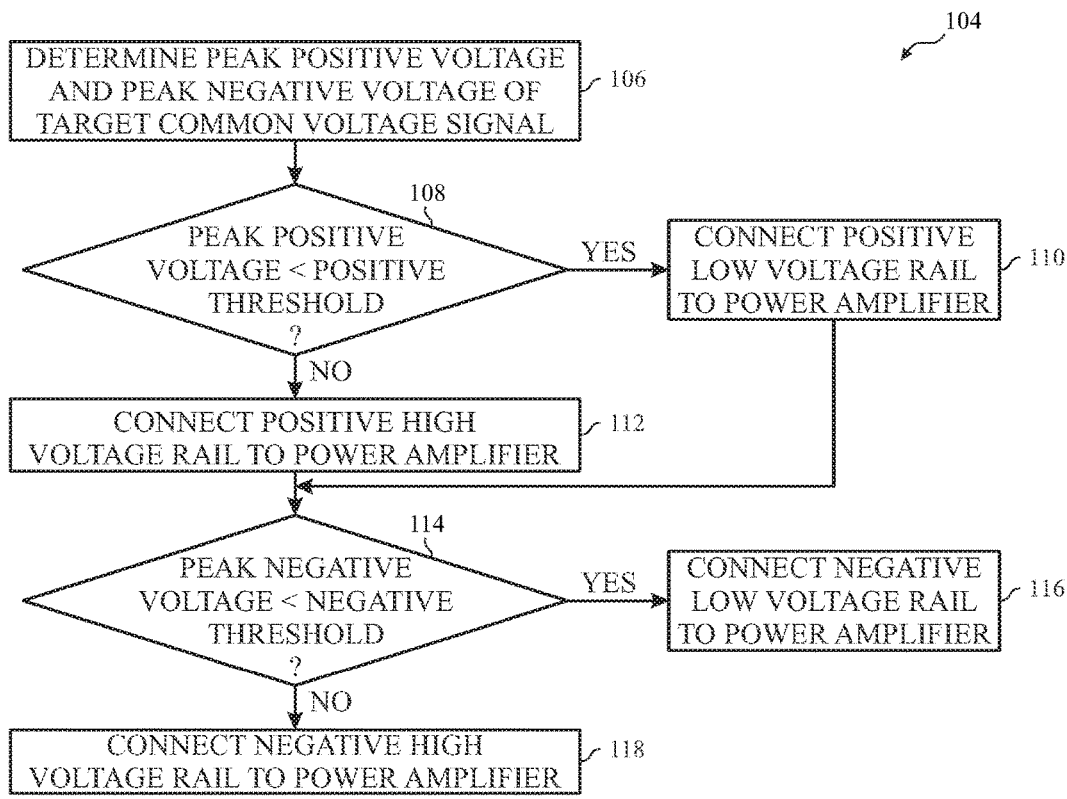
FIG. 10 is a flow diagram of a process for generating a common voltage supplied to the common electrode, in accordance with an embodiment.

To help illustrate, one embodiment of a process 104 for selectively connecting a positive voltage rail 74 and a negative voltage rail 76 to a power amplifier 64 is described in FIG. 10. Generally, the process 104 includes determining a peak positive voltage and a peak negative voltage of a target common voltage signal (process block 106), determining whether the peak positive voltage is less than a positive voltage threshold (decision block 108), connecting a positive low voltage supply rail to a power amplifier when the peak positive voltage is less than the positive voltage threshold (process block 110), and connecting a positive low voltage supply rail to the power amplifier when the peak positive voltage is not less than the positive voltage threshold (process block 112). Additionally, the process 104 includes determining whether the peak negative voltage is less than a negative voltage threshold (decision block 114), connecting a negative low voltage rail to the power amplifier when the peak negative voltage is less than the negative voltage threshold (process block 116), and connecting a negative high voltage rail to the power amplifier when the peak negative voltage is not less than the negative voltage threshold (process block 118). In some embodiments, the process 104 may be implemented by executing instructions stored in tangible, non-transitory, media, such as the controller memory 48, using processing circuitry, such as the controller processor 46.

Accordingly, in some embodiments, the display pipeline 36 and/or the common electrode driver 62 may determine peak positive voltage and peak negative voltage of the target common voltage signal (process block 106). In some embodiments, ability of the common electrode driver 62 to adjust the common voltage signal 68 may be less than instantaneous—particularly when changing power supply rails connected to the power amplifier 64. Thus, the peak positive voltage and/or the peak negative voltage may be local peaks selected from a portion of the target common voltage signal in a control horizon (e.g., duration sufficient to prepare common electrode driver 62 before changing common voltage signal 68). For example, the control horizon may include one or more display pixel groups ahead and/or one or more display pixel rows ahead.

Additionally, in some embodiments, the peak positive voltage may be voltage of a point on the target common voltage signal that is the largest positive voltage above the target common electrode voltage. In other words, depending on the target common electrode voltage, the peak positive voltage may in fact be a negative voltage. For example, when the target common electrode voltage is −1 volts, the peak positive voltage may be −0.8 volts.

Furthermore, in some embodiments, the peak negative voltage may be voltage of a point on the target common voltage signal that is the largest negative voltage below the target common electrode voltage. In other words, depending on the target common electrode voltage, the peak negative voltage may in fact be a positive voltage. For example, when the target common electrode voltage is 1 volt, the peak negative voltage may be 0.8 volts.

The display pipeline 36 and/or the common electrode driver 62 may determine whether the peak positive voltage is less than a positive voltage threshold (decision block 108). In some embodiments, the positive voltage threshold may be predetermined and stored, for example, in the controller memory 48. Additionally, in some embodiments, the positive voltage threshold may be determined based on voltage of electrical power supplied by each selectively connectable positive voltage supply rail 74. For example, the positive voltage threshold may set at or below a voltage (e.g., 1.8 volts) supplied by the positive low voltage rail 74A.

Thus, when the peak positive voltage is not less than the positive voltage threshold, the positive low voltage rail 74A may provide insufficient voltage for the power amplifier 64 to generate the common voltage signal 68 at the target voltage. Accordingly, the common electrode driver 62 may connect the power amplifier 64 to the positive high voltage rail 74B to enable the power amplifier to generate the common voltage signal 68 at the target voltage (process block 112). However, as described above, supplying electrical power from the positive high voltage rail 74B may increase power consumption compared to the positive low voltage rail 74A.

As such, when the peak positive voltage is not less than the positive voltage threshold and, thus, the positive low voltage rail 74A is capable of providing sufficient voltage to generate the target common voltage signal, the common electrode driver 62 may disconnect the positive high voltage rail 74B and connect the positive low voltage rail 74A. In this manner, the common electrode driver 62 may facilitate reducing power consumption while still enabling the generation of a common voltage signal 68 expected to sufficiently compensate negative net charge accumulation in the common electrode 58.

Additionally or alternatively, the display pipeline 36 and/or the common electrode driver 62 may determine whether the peak negative voltage is less than a negative voltage threshold (decision block 108). In some embodiments, the negative voltage threshold may be predetermined and stored, for example, in the controller memory 48. Additionally, in some embodiments, the negative voltage threshold may be determined based on voltage of electrical power supplied by each selectively connectable negative voltage rail 76. For example, the negative voltage threshold may set at or above a voltage (e.g., −1.8 volts) supplied by the negative low voltage rail 76A.

Thus, when the peak negative voltage is not less than the negative voltage threshold, the negative low voltage rail 76A may provide insufficient voltage for the power amplifier 64 to generate the common voltage signal 68 at the target voltage. Accordingly, the common electrode driver 62 may connect the power amplifier 64 to the negative high voltage rail 76B to enable the power amplifier to generate the common voltage signal 68 at the target voltage (process block 118). However, as described above, supplying electrical power from the negative high voltage rail 76B may increase power consumption compared to the negative low voltage rail 76A.

As such, when the peak positive voltage is less than the negative voltage threshold and, thus, the negative low voltage rail 76A is capable of providing sufficient voltage to generate the target common voltage signal, the common electrode driver 62 may disconnect the negative high voltage rail 76B and connect the negative low voltage rail 76A. In this manner, the common electrode driver 62 may facilitate reducing power consumption while still enabling the generation of a common voltage signal 68 expected to sufficiently compensate positive net charge accumulation in the common electrode 58.

As described above, in some embodiments, the display pipeline 36 may instruct the common electrode driver 62 to selectively connect one or more power supply rails to the power amplifier 64 via the supply rail control signal 82. As such, the common voltage control signal 66, which indicates the target common voltage signal, and the supply rail control signal 82 may both be determined based at least in part on the target common voltage signal. However, since ability of the common electrode driver 62 to output a higher voltage may be less than instantaneous and/or to facilitate reducing power consumption, the supply rail control signal 82 determined based on a point (e.g., peak) of the target common voltage signal may be provided to the common electrode driver 62 before the common voltage control signal 66 determined based on the same point.

For example, the display pipeline 36 may determine a supply rail control signal 82 and a common voltage control signal 66 based on the target common voltage signal when a first display pixel group is to be written. As such, the display pipeline 36 may provide the common voltage signal 66 to the common electrode driver 62 when the first display pixel group is to be written. However, the display pipeline 36 may provide the supply rail control signal 82 to the common electrode driver 62 before the first display pixel group is to be written, for example, while a second display pixel group the control horizon ahead of the first display pixel group is being written—particularly when the supply rail control signal 82 instructs the common electrode driver 62 to switch power supply rails. In this manner, the common electrode driver 62 may be allotted sufficient time to prepare for outputting higher voltages when switching to a higher voltage power supply rail and enable switching to a lower voltage power supply rail sooner, which may facilitate reducing power consumption.

Returning to the process 84 of FIG. 8, the common electrode driver 62 may generate the common voltage signal 68 by controlling supply of electrical power from one or more connected supply rails to an output 70 (process block 92). In some embodiments, the common electrode driver 62 may generate the common voltage signal 68 at a target voltage by amplifying the common voltage control signal 66. For example, the approximately linearly adjust supplied to the output 70 based on the common voltage control signal 66.

Accordingly, the technical effects of the present disclosure include improving perceived image quality while reducing power consumption of an electronic display. In some embodiments, a common electrode driver in the electronic display may predictively adjust a common voltage signal supplied to a common electrode based on expected net charge accumulation. In this manner, the common electrode driver may preemptively compensate for net charge accumulation resulting from writing display pixels, which may facilitate maintaining common electrode voltage constant and, thus, improving perceived image quality. Additionally, the common electrode driver may selectively connect one or more power supply rails based on target voltage of the common voltage signal. Furthermore, in some embodiments, the common electrode driver may selectively connect the one or more power supply rails in advance (e.g., one or more display pixel groups or rows) of peaks in the target common voltage signal, for example, to provide a power amplifier sufficient charging duration. In this manner, the common electrode driver may facilitate reducing power consumption by connecting lowest voltage magnitude power supply rails expected to still enable generating the common voltage signal at the target voltage.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. An electronic device comprising:
a first display pixel configured to display a first portion of an image frame, wherein the first display pixel comprises a first pixel electrode and a first common electrode;
a pixel electrode driver electrically coupled to the first display pixel, wherein the pixel electrode driver is configured to write the first portion of the image frame to the first display pixel by supplying a first pixel voltage signal to the first pixel electrode; and
a common electrode driver electrically coupled to the first common electrode, wherein the common electrode driver comprises:
a power amplifier configured to supply a first common voltage signal to the first common electrode to predictively offset a first net charge accumulation expected to be present in the first common electrode after writing the first display pixel;
a first power supply rail configured to be selectively connectable to the power amplifier based at least in part on a first target voltage of the first common voltage signal, wherein the first power supply rail is configured to supply electrical power with a first voltage to the power amplifier when connected; and
a second power supply rail configured to be selectively connectable to the power amplifier based at least in part on the first target voltage wherein the second power supply rail is configured to supply electrical power with a second voltage different from the first voltage to the power amplifier when connected.

2. The electronic device of claim 1, comprising a display pipeline communicatively coupled to the pixel electrode driver and the common electrode driver, wherein the display pipeline is configured to:
determine the first net charge accumulation based at least in part on a first charge injection in the first common electrode expected to result from writing the first display pixel;
determine a common voltage control signal supplied to the common electrode driver based at least in part on the first net charge accumulation, wherein the common voltage control signal indicates target voltage of the first common voltage signal; and
determine a supply rail control signal supplied the common electrode driver based at least in part on the target voltage of the first common voltage signal, wherein the supply rail control signal:
instructs the common electrode driver to connect the first power supply rail to the power amplifier when the target voltage is less than the first voltage over a control horizon; and
instructs the common electrode driver to connect the second power supply rail to the power amplifier when the target voltage is not less than the first voltage over the control horizon.

3. The electronic device of claim 2, wherein the display pipeline is configured to:
determine expected magnitude of the first pixel voltage signal based at least in part on image data that indicates target luminance of the first display pixel in the image frame;
determine expected polarity of the first pixel voltage signal based at least in part on inversion scheme implemented in a display panel comprising the first display pixel, location of the first display pixel on the display panel, or both; and
determine the first charge injection expected to result in the first common electrode based at least in part on the expected magnitude and the expected polarity of the first pixel voltage signal.

4. The electronic device of claim 2, comprising a second display pixel configured to display a second portion of the image frame, wherein:
the second display pixel comprises a second pixel electrode;
the pixel electrode driver is configured to write the second portion of the image frame to the second display pixel by supplying a second pixel voltage signal to the second pixel electrode; and
the display pipeline is configured to determine the first net charge accumulation based at least in part on a second charge injection in the first common electrode expected to result from writing the second display pixel.

5. The electronic device of claim 1, comprising a second display pixel configured to display a second portion of the image frame, wherein:
the second display pixel comprises a second pixel electrode and a second common electrode, wherein the second common electrode is electrically isolated from the first common electrode;
the pixel electrode driver is configured to write the second portion of the image frame to the second display pixel by supplying a second pixel voltage signal to the second pixel electrode;
the power amplifier configured to supply a second common voltage signal to the second common electrode to predictively offset a second net charge accumulation expected to be present in the second common electrode after writing the second display pixel;
the first power supply rail is configured to be selectively connectable to the power amplifier based at least in part on a second target voltage of the second common voltage signal; and
the second power supply rail is configured to be selectively connectable to the power amplifier based at least in part on the second target voltage.

6. The electronic device of claim 1, wherein the common electrode driver comprises:
a first switching device electrically coupled to the first power supply rail and to the power amplifier, wherein the first switching device is configured to:
close to connect the first power supply rail to the power amplifier when a peak voltage of the first target voltage is less than the first voltage over a control horizon; and
open to disconnect the first power supply rail from the power amplifier when the peak voltage is greater than the first voltage during the control horizon; and
a second switching device electrically coupled to the second power supply rail and to the power amplifier, wherein the second switching device is configured to:
open to disconnect the second power supply rail from the power amplifier when the peak voltage is less than the first voltage over the control horizon; and
close to connect the first power supply rail to the power amplifier when the peak voltage is greater than the first voltage during the control horizon, wherein magnitude of the second voltage is greater than magnitude of the first voltage.

7. The electronic device of claim 1, wherein:
the common electrode driver comprises:
a third power supply rail configured to be selectively connectable to the power amplifier based at least in part on the first target voltage of the first common voltage signal, wherein the third power supply rail is configured to supply electrical power with a first negative voltage to the power amplifier when connected; and a fourth power supply rail configured to be selectively connectable to the power amplifier based at least in part on the first target voltage, wherein the fourth power supply rail is configured to supply electrical power with a second negative voltage to the power amplifier when connected, wherein magnitude of the second negative voltage is greater than magnitude of the first negative voltage;

the first power supply rail is configured to supply a first positive voltage to the power amplifier when connected; and the second power supply rail is configured to supply a second positive voltage to the power amplifier when connected, wherein magnitude of the second positive voltage is greater than magnitude of the first positive voltage.

8. The electronic device of claim 1, wherein:
the common electrode driver comprises a third power supply rail configured to supply a negative voltage to the power amplifier;
the first power supply rail is configured to supply a first positive voltage to the power amplifier when connected; and
the second power supply rail is configured to supply a second positive voltage to the power amplifier when connected, wherein magnitude of the second positive voltage is greater than magnitude of the first positive voltage.

9. The electronic device of claim 1, wherein:
the first display pixel is configured to control light emission by using an electric field produced between the first pixel electrode and the first common electrode to adjust orientation of liquid crystals in the first display pixel; and
the power amplifier comprises a class-G power amplifier.

10. The electronic device of claim 1, wherein the electronic device comprises a portable phone, a media player, a personal data organizer, a handheld game platform, a tablet device, a computer, or any combination thereof.

11. A method for displaying an image frame on an electronic display, comprising:
processing, using a display pipeline, image data corresponding to the image frame to determine a first expected net charge accumulation in a common electrode due to supplying first pixel voltage signals to a first display pixel group in the electronic display to write a first portion of the image frame;
determining, using the display pipeline, a first common voltage control signal before the first portion of the image frame is written to the first display pixel group based at least in part on the first expected net charge accumulation, wherein:
the first common voltage control signal indicates a first target voltage of a common voltage signal to be output from a power amplifier in a display driver to the common electrode; and
the first target voltage of the common voltage signal is determined to offset the first expected net charge accumulation; and
determining, using the display pipeline, a first supply rail control signal before the first portion of the image frame is written to the first display pixel group based at least in part on the first target voltage of the common voltage signal, wherein the first supply rail control signal:
instructs the display driver to disconnect a first power supply rail from the power amplifier; and
instructs the display driver to connect a second power supply rail to the power amplifier.

12. The method of claim 11, wherein determining the first expected net charge accumulation comprises:
determining a positive charge injection metric that indicates expected positive charge injection into the common electrode due to writing the first display pixel group, wherein the positive charge injection metric comprises a first sum of positive voltages supplied via the first pixel voltage signals;
determining a negative charge injection metric that indicates expected negative charge injection into the common electrode due to writing the first display pixel group, wherein the negative charge injection metric comprises a second sum of negative voltage supplied via the first pixel voltage signals; and
determining a first magnitude, polarity, or both of the first expected net charge accumulation based at least in part on the positive charge injection metric and the negative charge injection metric.

13. The method of claim 12, wherein:
determining the polarity of the first expected net charge accumulation comprises:
determining that the polarity of the first expected net charge accumulation is positive when a second magnitude of the positive charge injection metric is greater than a third magnitude of the negative charge injection metric; and
determining that the polarity of the first expected net charge accumulation is negative when the third magnitude of the negative charge injection metric is greater than the second magnitude of the positive charge injection metric; and
determining the first magnitude of the first expected net charge accumulation comprises determining the first magnitude based at least in part on difference between the third magnitude of the negative charge injection metric and the second magnitude of the positive charge injection metric.

14. The method of claim 11, comprising:
communicating, using the display pipeline, the first supply rail control signal to the display driver while a second portion of the image frame is being written to a second display pixel group, wherein the second display pixel group is written before the first display pixel group in the electronic display; and
communicating, using the display pipeline, the first common voltage control signal to the display driver when the first display pixel group is to be written.

15. The method of claim 11, comprising:
processing, using the display pipeline, the image data corresponding to determine a second expected net charge accumulation in the common electrode due to supplying second pixel voltage signals to a second display pixel group in the electronic display to write a second portion of the image frame;
determining, using the display pipeline, a second common voltage control signal before the second portion of the image frame is written to the second display pixel group based at least in part on the second expected net charge accumulation, wherein:

the second common voltage control signal indicates a second target voltage of the common voltage signal to be output from the power amplifier to the common electrode;

the second target voltage of the common voltage signal is determined to offset the second expected net charge accumulation; and determining, using the display pipeline, a second supply rail control signal before the second portion of the image frame is written to the second display pixel group based at least in part on the second target voltage of the common voltage signal, wherein the second supply rail control signal:

instructs the display driver to connect the first power supply rail to the power amplifier; and instructs the display driver to disconnect the second power supply rail from the power amplifier.

16. The method of claim 11, wherein determining the first supply rail control signal comprises:

determining peak voltage of the first target voltage over a control horizon;

determining a threshold voltage based at least in part on a first voltage of electrical power supplied from the first power supply rail when connected to the power amplifier; and determining the first supply rail control signal when the peak voltage is greater than the threshold voltage to enable the power amplifier to generate the first target voltage using electrical power at a second voltage greater than the first voltage supplied from the second power supply rail.

17. A tangible, non-transitory, computer-readable medium that stores instructions executable by one or more processors in an electronic device, wherein the instructions comprise instructions to:

determine, using the one or more processors, a positive charge injection metric that indicates expected positive charge injection in a common electrode caused by writing a first portion of an image frame to a first display pixel row on a display panel;

determine, using the one or more processors, a negative charge injection metric that indicates expected negative charge injection in the common electrode caused by writing a second portion of the image frame to a second display pixel row on the display panel, wherein the second display pixel row is adjacent the first display pixel row;

instruct, using the one or more processors, a common electrode driver to supply a common voltage signal at a target voltage to the common electrode, wherein the target voltage is determined based at least in part on the positive charge injection metric and the negative charge injection metric;

instruct, using the one or more processors, the common electrode driver to connect one positive voltage rail of a plurality of positive voltage rails to a power amplifier that generates the common voltage signal based at least in part on the target voltage, wherein:

each of the plurality of positive voltage rails supplies a different positive voltage when connected to the power amplifier; and the one positive voltage rail supplies a lowest positive voltage among the plurality of positive voltage rails greater than the target voltage over a control horizon.

18. The computer-readable medium of claim 17, wherein:

the instructions to determine the positive charge injection metric comprise instructions to determine a first voltage sum of first pixel voltage signals to be used to write the first portion of the image frame to the first display pixel row; and the instructions to determine the negative charge injection metric comprises instructions to determine a second voltage sum of second pixel voltage signals to be used to write the second portion of the image frame to the second display pixel row.

19. The computer-readable medium of claim 17, wherein the instructions to instruct the common electrode driver to connect the one positive voltage rail of the plurality of positive voltage rails comprise instructions to:

instruct the common electrode driver to connect a first positive voltage rail of the plurality of positive voltage rails when a peak target voltage of the common voltage signal over the control horizon is less than a positive voltage threshold; and instruct the common electrode driver to connect a second positive voltage rail of the plurality of positive voltage rails when the peak target voltage over the control horizon is not less than the positive voltage threshold.

20. The computer-readable medium of claim 17, comprising instructions to:

instruct, using the one or more processors, a pixel electrode driver to write the first portion of the image frame by supplying negative pixel voltage signals to first pixel electrodes of the first display pixel row; and instruct, using the one or more processors, the pixel electrode driver to write the second portion of the image frame directly after the first portion of the image frame by supplying positive pixel voltage signals to second pixel electrodes of the second display pixel row.

* * * * *